United States Patent [19]

Aussant et al.

[11] Patent Number: 5,698,990

[45] Date of Patent: Dec. 16, 1997

[54] COUNTERFORCE SPRING ASSEMBLY FOR PRINTED CIRCUIT BOARD TEST FIXTURES

[75] Inventors: James R. Aussant, N. Dighton; Robert A. Morin, S. Attleboro; John M. Winter, Wrentham, all of Mass.

[73] Assignee: Southwest Test Inc., Richardson, Tex.

[21] Appl. No.: 677,920

[22] Filed: Jul. 10, 1996

[51] Int. Cl.⁶ ................................................. G01R 31/02
[52] U.S. Cl. .................................................. 324/761
[58] Field of Search .................... 73/866.5; 324/754, 324/755, 757, 758, 761; 209/573, 574

[56] References Cited

U.S. PATENT DOCUMENTS

| | | | |
|---|---|---|---|
| 4,017,793 | 4/1977 | Haines | 324/73 PC |
| 4,322,682 | 3/1982 | Schadwill | 324/761 |
| 4,625,164 | 11/1986 | Golder et al. | 324/158 F |
| 4,644,269 | 2/1987 | Golder et al. | 324/158 F |
| 4,686,468 | 8/1987 | Lee et al. | 324/158 F |
| 4,700,132 | 10/1987 | Yarbrough et al. | 324/158 F |
| 4,739,257 | 4/1988 | Jenson et al. | 324/158 F |
| 4,749,945 | 6/1988 | Bonifert et al. | 324/158 F |
| 4,906,920 | 3/1990 | Huff et al. | 324/158 P |
| 5,068,600 | 11/1991 | Hilz et al. | 324/158 F |
| 5,227,718 | 7/1993 | Stowers et al. | 327/761 |
| 5,252,916 | 10/1993 | Swart | 324/158 P |
| 5,396,186 | 3/1995 | Scheutzow | 324/755 |

*Primary Examiner*—Robert Raevis
*Attorney, Agent, or Firm*—Barlow & Barlow, Ltd.

[57] ABSTRACT

A counterforce spring assembly for printed circuit board test fixtures is provided. A number of counterforce spring assemblies are provided in an array between the top plate and probe plate of the test fixture. Each counterforce spring assembly includes a support cup residing in an aperture through the probe plate. A compression spring resides in the support cup and provides spring-biasing of the top plate to the probe plate during the UUT testing cycle. Each counterforce spring assembly includes a circumferential flange to limit downward travel of the top plate toward the probe plate. Each assembly is small enough to fit between probe apertures corresponding to component leads of the UUT. The counterforce spring assemblies can be freely placed underneath the top plate to provide even spring-biasing thereof to prevent bowing and bending of the top plate which often causes errors in the testing of printed circuit boards.

18 Claims, 5 Drawing Sheets

COUNTERFORCE SPRING ASSEMBLY FOR PRINTED CIRCUIT BOARD TEST FIXTURES

BACKGROUND OF THE INVENTION

The present invention relates generally to a test fixture for printed circuit boards. More specifically, the present invention relates to a counterforce spring assembly system for a test fixture for the automatic testing of printed circuit boards.

In the field of automatic testing equipment (ATE), it has been well known to employ a vacuum actuated test fixture for receiving electronic circuit devices to be tested and then electrically interconnecting the electronic circuit devices to the automatic testing equipment. In the prior art, it has been well known for the automatic testing equipment to include a plate, commonly referred to as a probe plate, for carrying an array of test probes. Also, a board is provided for carrying the electronic circuit device to be tested, commonly referred to as a top plate or diaphragm board. A gasket is typically provided on a top plate to support the electronic circuit device during testing. The gasket also serves to seal the periphery of the electronic circuit device to the top plate. The top plate is typically positioned above and in spring-biased relation to the probe plate. As a result, a chamber is formed between the probe plate and the top plate. To actuate the top plate into contact with the test probes present on the probe plate for testing, air in the chamber is evacuated to create a vacuum therein. As a result, the top plate is drawn toward the probe plate for testing of the electronic circuit device. The vacuum is maintained by a seal system present between the top plate, probe plate and electronic circuit board to be tested via the aforementioned gasket.

In the printed circuit board test fixture industry, the actuation of the top plate toward an array from the probe plate is critical because this actuation introduces the unit under test (UUT) to the test probes residing in the probe plate. It is important that the top plate, which carries the electronic circuit device, be parallel or substantially parallel to the probe plate throughout the testing procedure. If the top plate and the probe plate are not parallel to one another during testing, the test probes will not be evenly introduced to the electronic circuit device for testing or components installed on the UUT may be damaged. As a result, testing will likely fail and/or UUT damage may occur under such conditions.

Due to the introduction of a vacuum between the top plate and the probe plate, the top plate may bow or bend thus causing the electronic circuit device to bow or bend resulting in poor contact of the test probes to the underside of the electronic circuit device. This bowing or bending of the top plate and the electronic circuit device often occurs when the only support for the top plate resides about the periphery of the entire test fixture. To address this bowing or bending problem, various attempts have been made to evenly distribute the load of the top plate about the surface of the probe plate rather than only about its periphery.

For example, coil springs may be provided about the surface of the probe plate to distribute the load of the top plate. Such coil springs typically reside in a seat provided in the top surface of the probe plate. These springs are typically large in diameter and cannot be placed proximal to the electronic circuit device due to their size. For example, U.S. Pat. No. 4,625,164, issued to Golder et al., and U.S. Pat. No. 4,017,793, issued to Haines, both disclose such large diameter coil springs which reside in a seat in the probe plate.

With the advent of larger, more heavily populated electronic circuit board devices, the concern for bowing and bending is increasing. As a result, support about the actual electronic circuit device as well as directly under the electronic circuit device is required. Since these circuit devices or boards are so heavily populated, there is often little room for the prior art coil springs residing in a seat in the probe plate. Since the large springs require a seat, they cannot reside directly under the electronic circuit device, particularly under a contact lead which needs to be tested because that region directly thereunder will be occupied by a test probe. In addition, there are prior art springs for supporting the top plate which seat themselves within an actual vacant test probe hole in the probe plate. As can be understood, these springs suffer from the same disadvantages as springs residing in the seat in a probe plate because they take up valuable real estate directly under the electronic circuit device to be tested or UUT.

Due to the demand for a counterforce spring assembly which can provide additional spring-biasing to prevent top plate and electronic circuit device bowing as well as provide spring-biasing under the UUT itself, it is desirable for a counterforce spring assembly to be extremely small in profile to be capable of residing directly under the UUT yet strong enough to provide sufficient spring-biasing for the top plate. It is also desirable to provide a counterforce spring assembly which can support a top plate when the test fixture is not in a testing condition as well as providing a stop for preventing excess downward travel of the top plate toward the probe plate.

SUMMARY OF THE INVENTION

The present invention preserves the advantages of prior art counterforce spring assemblies for use in printed circuit board automatic testing equipment. In addition, it provides new advantages not found in currently available counterforce spring assemblies, and overcomes many disadvantages of such assemblies.

The invention is generally directed to a novel and unique counterforce spring assembly for use in automatic testing equipment test fixtures with particular application in testing printed circuit boards. The counterforce spring assembly of the present invention enables the simple, easy and inexpensive addition of evenly distributed spring-biasing of a top plate relative to a probe plate while preventing bowing of the top plate and/or UUT.

The preferred embodiment of the present invention includes a probe plate having an upper surface and a circumferential edge. The probe plate includes a number of test probe apertures and a number of counterforce spring assembly apertures. A number of test probes reside in and through the test probe apertures while a number of counterforce spring assemblies reside in and through the counterforce spring assembly apertures, respectively. A peripheral spring seal member is positioned on the upper surface of the probe plate and proximal to the circumferential edge of the probe plate. A top plate, having an upper surface, is positioned on the peripheral spring seal member and the counterforce spring assemblies with the top plate defining a number of test probe pass-through holes. Upon creation of a vacuum between the top plate and the probe plate, the top plate will be dram toward the probe plate permitting the test probes to pass through the test probe apertures.

In particular, each counterforce spring assembly includes a support cup with an open top, a closed bottom with a floor and an inner wall. A circumferential flange, with a predetermined thickness, is disposed about and flush with the open top. A compression spring resides in the support cup with a portion thereof extending above the open top. The support cup resides in a counterforce spring assembly aperture with the circumferential flange providing a stop for downward travel of the support cup into the counterforce spring assembly aperture. The circumferential flange also provides a spacer stop for limiting the downward travel of the top plate toward the probe plate by a length equal to the thickness of the circumferential flange.

It is therefore an object of the present invention to provide a counterforce spring assembly for printed circuit board test fixtures that are small and compact.

Another object of the present invention is to provide a counterforce spring assembly for printed circuit board test fixtures which can be distributed under the top plate to prevent bowing of the top plate and the UUT.

It is a further object of the present invention to provide a counterforce spring assembly for printed circuit board test fixtures which can be placed in an array of multiple assemblies under the top plate about the UUT to provide a preseal during testing. It is yet a further object of the present invention to provide a counterforce spring assembly for printed circuit board test fixtures which can be placed directly underneath the UUT between electronic device components and contacts to be tested.

It is another object of the present invention to provide a counterforce spring assembly for printed circuit board test fixtures which can be placed below the UUT between components and contacts to be tested without using a test probe hole. It is yet a further object of the present invention to provide a counterforce spring assembly for printed circuit board test fixtures which can spring-bias the top plate relative to the probe plate as well as provide a stop to limit the downward travel of the top plate toward the probe plate.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
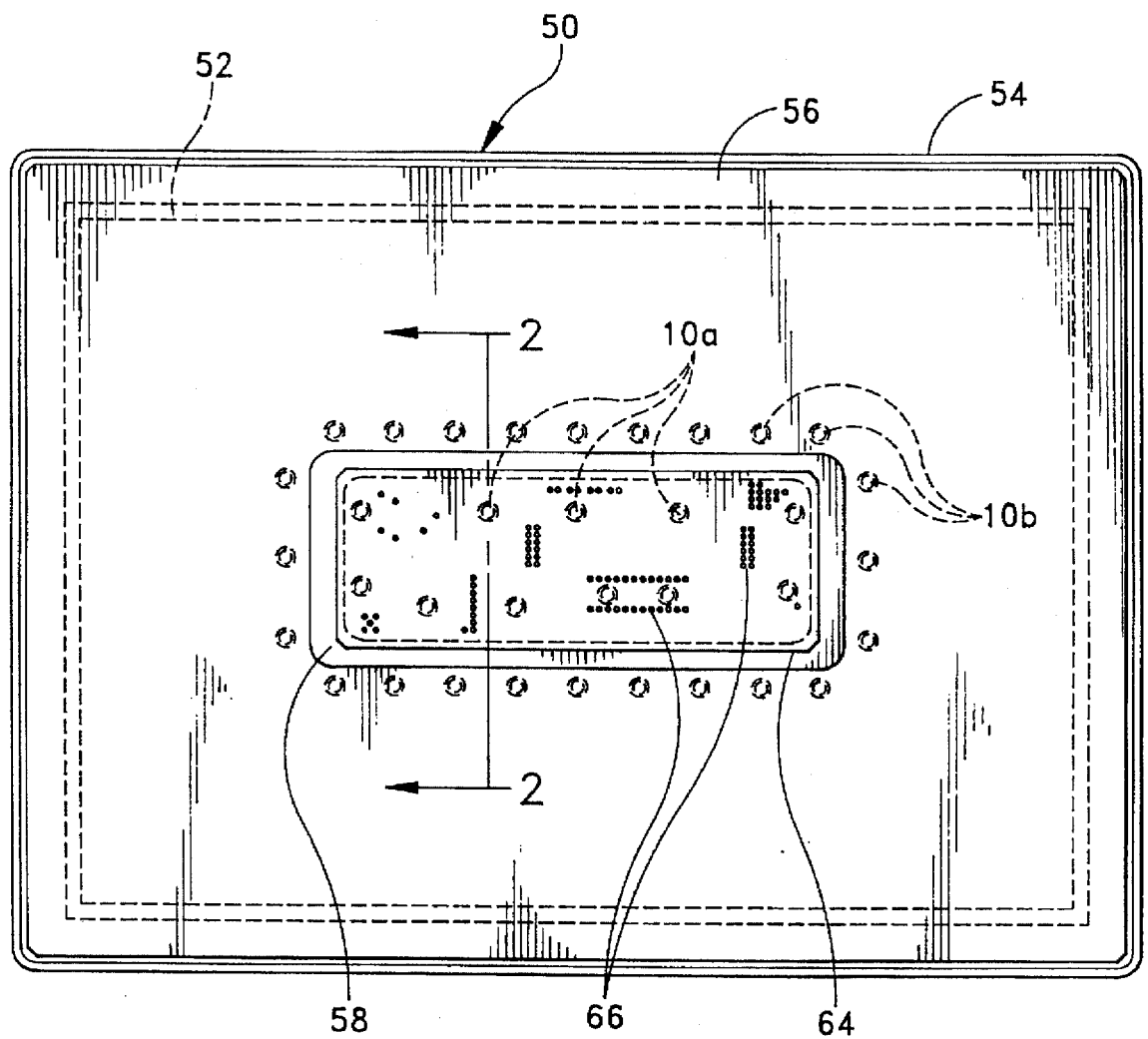
FIG. 1 is a plan view of a test fixture employing a number of counterforce spring assemblies in accordance with the present invention.

Referring to FIG. 1, a plan view of a printed circuit board test fixture employing a number of the counterforce spring assembly of the present invention is shown. Test fixture 50 includes probe plate 54, top plate 56 with peripheral spring seal member 52 residing therebetween. As will be discussed in more detail below, gasket 58 is provided on top plate 56 to serve as a seat for unit under test (UUT) 60. The counterforce assembly at the present invention is generally referenced 10. FIG. 1 illustrates the employment of the counterforce spring assemblies 10b of the present invention which are arranged preferably about the periphery of gasket 58 as well as assemblies 10a dispersed between component leads (not shown) on UUT 60 which correspond to test probe apertures 66. As will be discussed in detail below, this particular arrangement and layout of this array of counterforce spring assemblies generally referenced as 10, in accordance with the present invention, greatly improves the operation and efficiency of test fixture 50. Counterforce spring assemblies 10a and 10b are identical and are referenced as such to facilitate understanding of the placement of the counterforce spring assembly 10, of the present invention, on test fixture 50.

Figure 2:
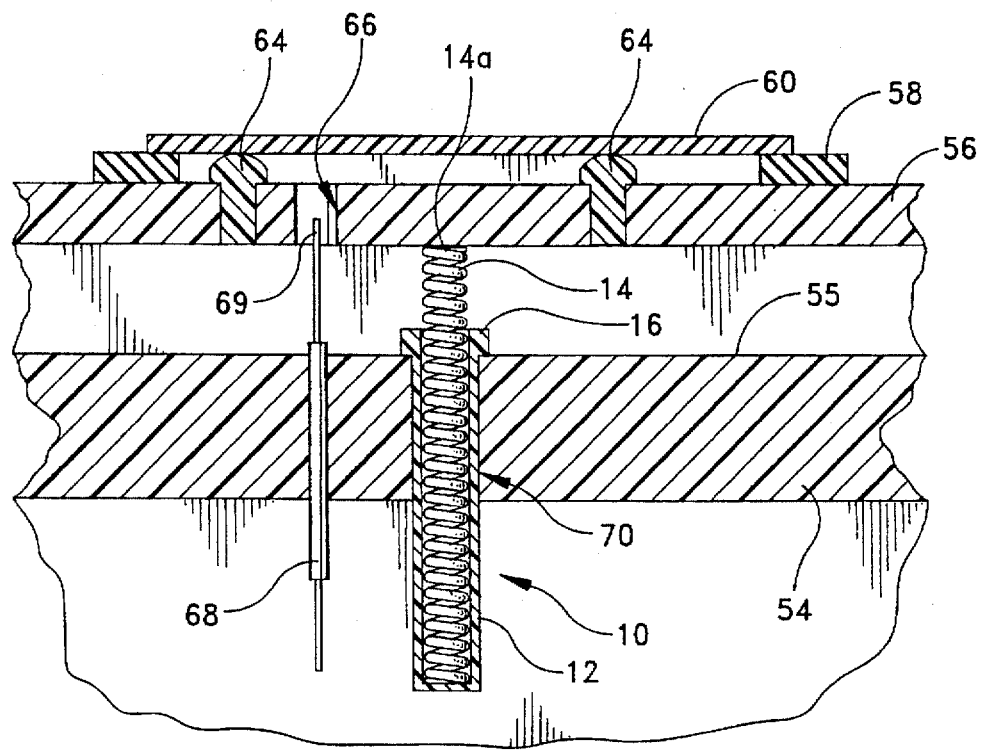
FIG. 2 is a cross-sectional view through the line 2—2 of the test fixture and counterforce spring assembly of FIG. 1 in a resting state prior to testing.
Figure 3:
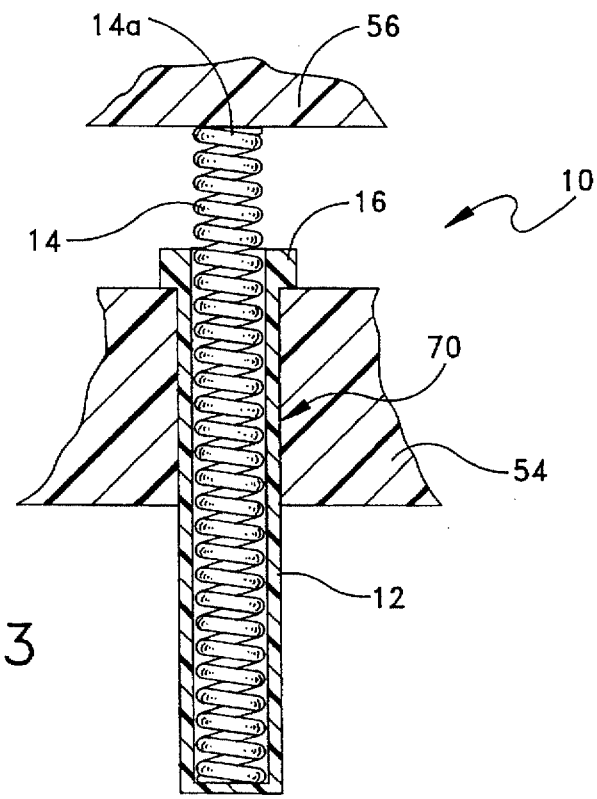
FIG. 3 is a close-up view of the counterforce spring assembly shown in FIG. 2.

Turning now to FIG. 2, a cross-sectional view through the line 2—2 of FIG. 1 is shown. In conjunction with FIG. 3, which is a close-up view of the counterforce spring assembly 10 of the present invention, FIG. 2 illustrates the employment of counterforce spring assembly 10 to spring-bias top plate 56 relative to probe plate 54. FIGS. 2 and 3 show such spring-biasing when the test fixture is in a resting or non-testing state. In this resting state, no vacuum is present in the chamber between top plate 56 and probe plate 54. As a result, top plate 56 simply rests on counterforce spring assembly 10. As can be seen in FIG. 1, counterforce spring assemblies 10b are preferably arranged about the periphery of gasket 58, which supports UUT 60, and assemblies 10a are directly under various components installed on UUT 60 which are represented by component test probe apertures 66. As a result of the arrangement of counterforce spring assemblies 10 (10a and 10b ) shown in FIG. 1, the UUT 60 is presealed to top plate 56 via gasket 58. The presence of counterforce spring assemblies 10b about the periphery of gasket 58 creates an immediate seal at gasket 58 upon creation of a vacuum between top plate 56 and probe plate 54 because counterforce spring assemblies 10b provide additional support in a region of gasket 58 to give it better sealing contact between UUT 60 and top plate 56. As a result of the configuration of counterforce spring assemblies 10b about gasket 58, improved sealing and seating of UUT 60 occurs which results in more efficient and accurate testing.

As also can be seen in FIG. 1, counterforce spring assemblies 10a reside directly under top plate 56 in the region of UUT 60. In particular, counterforce spring assemblies 10a are small enough to be placed between test probe apertures 66 which correspond to leads of components installed on the UUT (not shown). Due to the size of prior art spring assemblies for spring-biasing a top plate to a probe plate, positioning of a counterforce spring assembly 10a directly under an installed component is not possible. Due to the small circumference counterforce spring assembly 10a of the present invention, these assemblies 10 may be placed in a wide variety of areas directly below the UUT 60 itself to ensure that no bowing or bending occurs during the testing process when a vacuum exists between probe plate 54 and top plate 56. Due to the small size of the counterforce spring assembly 10 of the present invention, test probe apertures 66 or "spare" apertures 66 in top plate 56 do not have to be occupied which provides added flexibility in test fixture design. In particular, the ability to locate and position a counterforce spring assembly 10 directly under or proximal to a component installed on UUT 60 is of critical importance because these locations must be evenly distributed and level during testing because these locations will receive test probes therethrough. If the regions directly under and around the components to be tested bend or bow, inaccurate or failed testing may result. In view of the foregoing, the ability to place the counterforce spring assemblies 10 of the present invention about gasket 58 as well as at critical points under UUT 60 provides advantages not found in the prior art.

Figure 6:
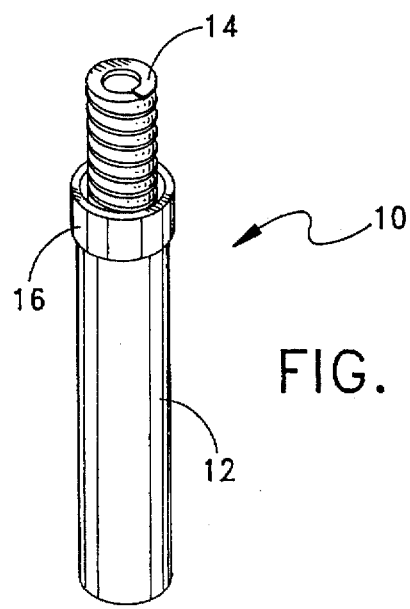
FIG. 6 is a perspective view of the counterforce spring assembly of the present invention.
Figure 7:
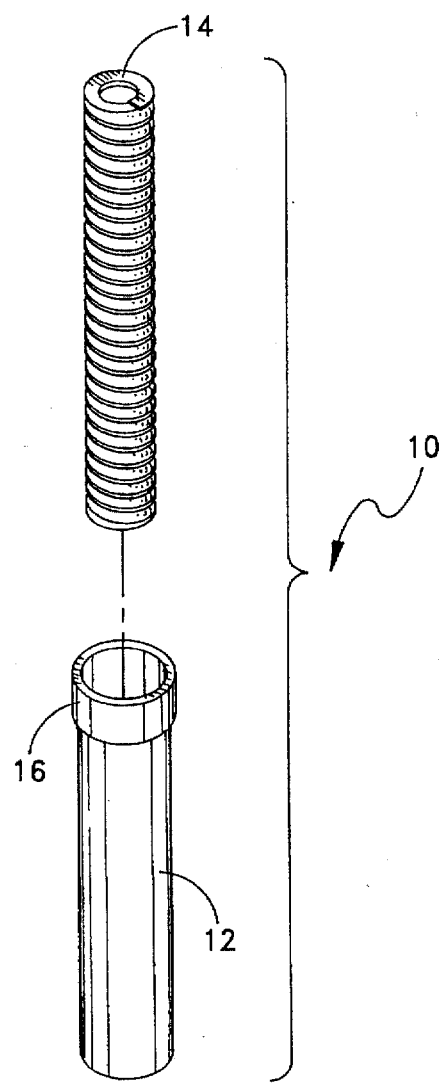
FIG. 7 is an exploded view of the counterforce spring assembly of FIG. 6.
Figure 8:
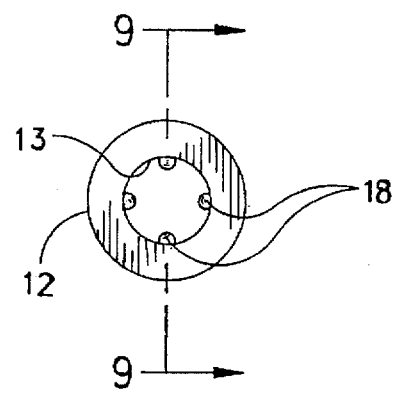
FIG. 8 is a top view of the support cup of the counterforce spring assembly of the present invention.
Figure 9:
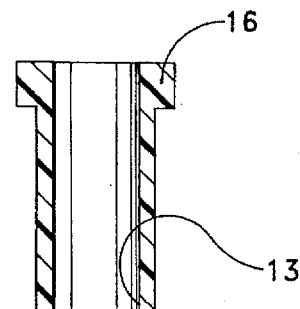
FIG. 9 is a cross-sectional view through the line 9—9 of FIG. 8.
Figure 10:
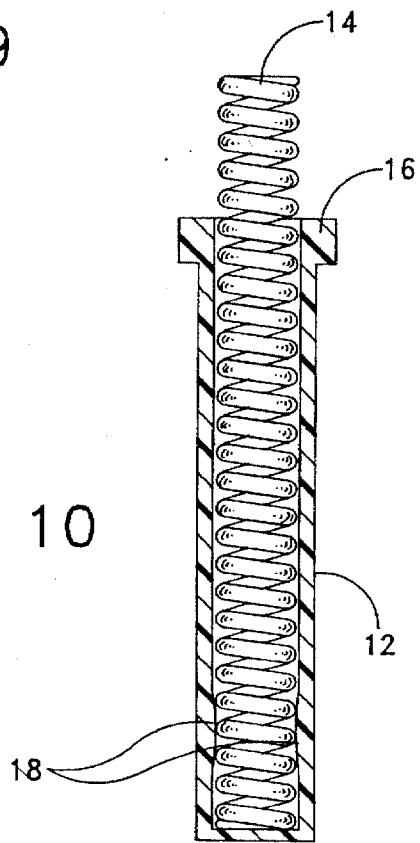
FIG. 10 is a partial cross-sectional view of the support cup of FIG. 8 with a spring residing and secured within the support cup in accordance with the present invention.

Turning now to FIGS. 6–10, the construction of a counterforce spring assembly 10 of the present invention is shown. Referring first to FIGS. 6 and 7, a preferred embodiment of counterforce spring assembly 10 is shown to include support cup 12 with a closed bottom end and an open top end. Positioned at the open top end of support cup 12 is a circumferential flange 16. Residing within support cup 12 is coil spring 14. FIGS. 8–10 illustrate an alternative embodiment of the present invention which includes a number of protrusions 18 emanating from the inner wall 13 of support cup 12. FIG. 8 shows a top view of support cup 12 with four protrusions 18. As shown in FIGS. 9 and 10, protrusions 18 are preferably located toward the bottom of support cup 12. Upon insertion of coil spring 14 into support cup 12, protrusions 18 frictionally engage the lower portion of coil spring 14. As a result, coil spring 14 is removably secured to support cup 12 via the friction fit with protrusions 18 and will not fall out if test fixture 50 is tipped beyond 90 degrees. It should be understood that the number of protrusions 18 and the locations thereof may be modified in accordance with the particular size and shape of the coil spring 14. For example, protrusions 18 may be larger or moved up along the inner wall 13 of support cup 12.

As discussed above, prior art top plate biasing springs are typically large in diameter with a relatively small height. However, such large diameter springs take up valuable real estate underneath the top plate 56 particularly in the region under UUT 60. The counterforce spring assembly of the present invention is unique in that the counterforce spring that is employed preferably has an outside diameter of only 0.156 inches as well as a free length of 1.5 inches. The wire diameter is preferably 0.037 inches while the spring rate is 60 pounds per inch. Further, the load at working height is preferably 18 pounds at 1.2 inches of height. The employment of such a compression spring in the counterforce spring assembly of the present invention enables firm spring-biasing appropriate for printed circuit board test fixtures while employing little real estate under top plate 56. Further, for ease of manufacture and to reduce outlay, support cup 12 is preferably molded plastic and the coil spring 14 is preferably metal material. While the foregoing materials and dimensions are preferred, various modification can be made to the size and characteristics of coil spring 14 and spring cup 12 and still be within the scope of the present invention.

Turning now to FIGS. 2–5, the operation of counterforce spring assembly 10 is shown. Referring first to FIGS. 2 and 3, one counterforce spring assembly 10 of the array of counterforce spring assemblies shown in FIG. 1 is shown and will be discussed for illustrative purposes. The remaining assemblies in the array function in the same way. Further, one test probe 68 is shown as being representative of a number of test probes employed in test fixture 50. FIG. 2 shows support cup 12 residing within counterforce spring assembly aperture 70 in probe plate 54. Circumferential flange 16 rests on the top surface 55 to prevent further downward travel of support cup 12 through counterspring assembly aperture 70. Also disposed through the probe plate 54 is test probe 68 with tip 69 extending above top surface 55 of probe plate 54. Top plate 56 rests on peripheral spring seal member 52 (not shown in FIGS. 2–5) as well as the top surface 14a of coil spring 14. Tip 69 of test probe 68 resides within test probe aperture 66 in top plate 56. Further, UUT supports 64 are provided to further balance and support UUT 60 on gasket 58. FIGS. 2 and 3 show test fixture 50 in a resting or non-testing state.

Figure 4:
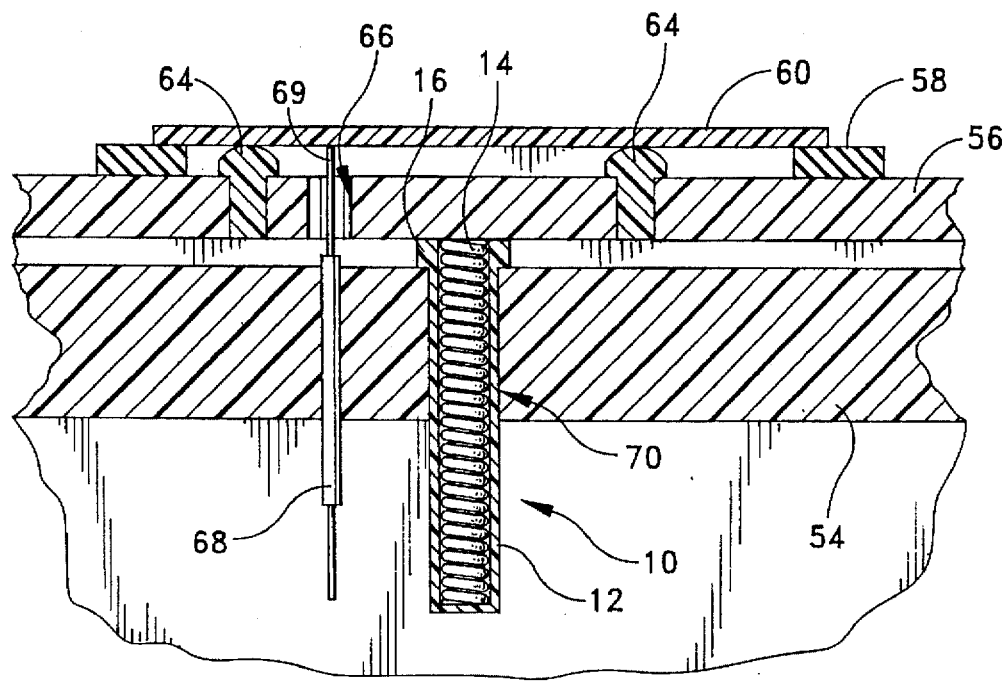
FIG. 4 is a cross-sectional view through the line 2—2 of FIG. 1 with the top plate actuated toward the probe plate in a test state.
Figure 5:
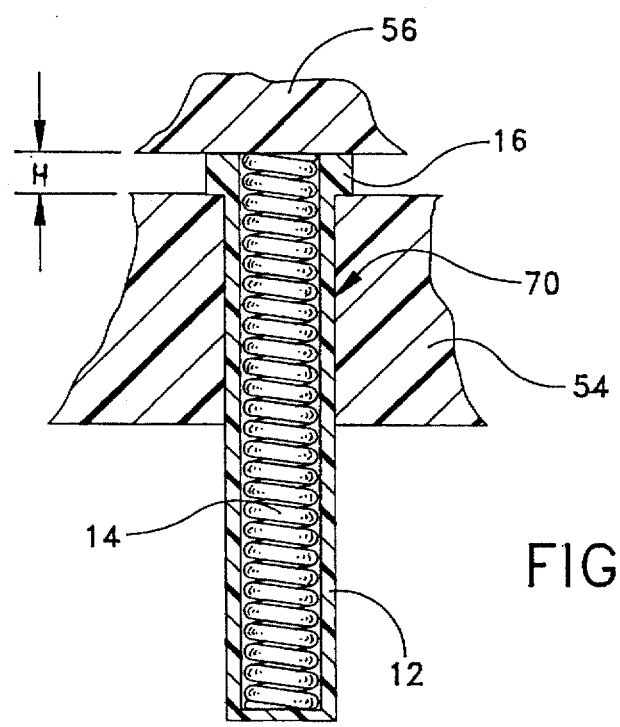
FIG. 5 is a close-up view of the counterforce spring assembly shown in FIG. 4.

The condition of a UUT 60 under test is shown in FIGS. 4 and 5. In particular, FIG. 4 shows the results of introduction of a vacuum between top plate 56 and probe plate 54. As a result of the vacuum, top plate 56 is drawn toward probe plate 54 against the forces of counterforce spring assembly 10 as well as the other counterforce spring assemblies 10 in the array (see FIG. 1). Upon this actuation of top plate 56, coil spring 14 compresses within support cup 12 to spring-bias top plate 56. Simultaneously, test probe 68 travels through test probe aperture 66 to permit tip 69 to contact the underside of UUT 60 for testing. As can be seen in greater detail in FIG. 5, the downward travel of top plate 56 as a result of the vacuum is limited by the height H of circumferential flange 16. As a result, circumferential flange 16 provides the dual purpose of preventing downward travel of support cup 12 through counterforce spring assembly aperture 70 as well as limiting the downward travel of top plate 56 toward probe plate 54.

As a result of the small profile of the counterforce spring assembly 10 of the present invention, it can be placed proximal to and/or between test probe apertures 66 which typically correspond with component leads on the underside of the UUT 60. The ability for the counterforce spring assembly 10 to extend below probe plate 54 enables the use of a high-compression spring 14 to give the required compression needed for printed circuit board test fixture applications. The employment of a circumferential flange 16 further adds accuracy to the downward travel and resting of top plate 56 during the testing state without the need for additional top plate stops positioned about and on the top surface 55 of probe plate 54.

It would be appreciated by those skilled in the art that various changes and modifications can be made to the illustrated embodiments without departing from the spirit of the present invention. All such modifications and changes are intended to be covered by the appended claims.

What is claimed is:

1. An automatic testing equipment test fixture for a printed circuit board having electronic devices, with connector leads, installed therein, comprising:

a probe plate having an upper surface and a circumferential edge; said fixture probe plate defining a plurality of test probe apertures and at least one counterforce spring assembly aperture;

a plurality of test probes residing in and through said test probe apertures, respectively;

at least one counterforce spring assembly residing in and through said at least one counterforce spring assembly aperture, respectively; said at least one counterforce spring assembly including a support cup with an open top, a closed bottom with a floor and an inner wall; a circumferential flange, having a predetermined thickness, disposed about and flush with said open top; a spring residing in said support cup with an upper portion of said spring exposed above said open top; said support cup residing in said at least one counterforce spring assembly aperture with said circumferential flange providing a stop for downward travel of said support cup in said at least one counterforce spring assembly aperture and providing a spacer stop for limiting the downward travel of said top plate toward said probe plate by a length equal to the thickness of said circumferential flange;

peripheral spring member means positioned on said upper surface and proximal to said circumferential edge;

a top plate having an upper surface; said top plate being positioned on said peripheral spring member means and said at least one counterforce spring assembly; said top plate defining a plurality of test probe pass-through holes; and whereby creation of a vacuum between said top plate and said probe plate draws said top plate toward said probe plate thereby permitting said test probes to pass through said test probe apertures.

2. The test fixture of claim 1, wherein said support cup is plastic.

3. The test fixture of claim 1, wherein said spring has a outer diameter of approximately 0.156 inches.

4. The test fixture of claim 1, wherein said spring has a free length of approximately 1.5 inches.

5. The test fixture of claim 1, wherein said spring has a wire diameter of approximately 0.037 inches.

6. The test fixture of claim 1, wherein said spring has a spring rate of approximately 60 pound per inch.

7. The test fixture of claim 1, wherein said spring has a working load of 18 pounds per inch at a working height of 1.2 inches.

8. The test fixture of claim 1, wherein said support cup further includes a plurality of protrusions emanating from said inner; said protrusions being frictionally engageable with said spring upon insertion of said spring into said support cup to secure said spring relative to said support cup.

9. The test fixture of claim 1, wherein said at least one counterforce spring assembly resides below a printed circuit board to be tested and between test probes corresponding to connector leads of an electronic device installed on said printed circuit board.

10. An automatic testing equipment test fixture for a printed circuit board having electronic devices, with connector leads, installed therein, comprising:

a probe plate having an upper surface and a circumferential edge; said fixture probe plate defining a plurality of test probe apertures and at least one counterforce spring assembly aperture;

a plurality of test probes residing in and through said test probe apertures, respectively;

at least one counterforce spring assembly residing in and through said at least one counterforce spring assembly aperture, respectively; said at least one counterforce spring assembly residing below a printed circuit board to be tested and between test probes corresponding to connector leads of an electronic device installed on said printed circuit board;

peripheral spring member means positioned on said upper surface and proximal to said circumferential edge;

a top plate having an upper surface; said top plate being positioned on said peripheral spring member means and said at least one counterforce spring assembly; said top plate defining a plurality of test probe pass-through holes; and whereby creation of a vacuum between said top plate and said probe plate draws said top plate toward said probe plate thereby permitting said test probes to pass through said test probe apertures.

11. The test fixture of claim 10, wherein said at least one counterforce spring assembly comprises:

a support cup with an open top, a closed bottom with a floor and an inner wall;

a circumferential flange, having a predetermined thickness, disposed about and flush with said open top; a spring residing in said support cup with an upper portion of said spring exposed above said open top;

said support cup residing in said at least one counterforce spring assembly aperture with said circumferential flange providing a stop for downward travel of said support cup in said at least one counterforce spring assembly aperture and providing a spacer stop for limiting the downward travel of said top plate toward said probe plate by a length equal to the thickness of said circumferential flange.

12. The test fixture of claim 11, wherein said support cup is plastic.

13. The test fixture of claim 11, wherein said spring has a outer diameter of approximately 0.156 inches.

14. The test fixture of claim 11, wherein said spring has a free length of approximately 1.5 inches.

15. The test fixture of claim 11, wherein said spring has a wire diameter of approximately 0.037 inches.

16. The test fixture of claim 11, wherein said spring has a spring rate of approximately 60 pounds per inch.

17. The test fixture of claim 11, wherein said spring has a working load of 18 pounds per inch at a working height of 1.2 inches.

18. The test fixture of claim 11, wherein said support cup further includes a plurality of protrusions emanating from said inner; said protrusions being frictionally engageable with said spring upon insertion of said spring into said support cup to secure said spring relative to said support cup.

* * * * *